United States Patent [19]
Park

[11] Patent Number: 5,915,080
[45] Date of Patent: Jun. 22, 1999

[54] REPROGRAMMING DEVICE OF A FLASH MEMORY

[75] Inventor: Hong-Kil Park, Kyungki-do, Rep. of Korea

[73] Assignee: SamSung Electronics Co., Ltd., Kyungki-do, Rep. of Korea

[21] Appl. No.: 08/758,769

[22] Filed: Dec. 3, 1996

[30] Foreign Application Priority Data

May 12, 1995 [KR] Rep. of Korea ...................... 95-46780

[51] Int. Cl.$^6$ ................................................. G06F 11/00
[52] U.S. Cl. ...................................... 395/182.04; 371/30
[58] Field of Search ................... 395/182.03, 182.04, 395/180, 181, 182.01, 182.18, 183.05, 183.12, 183.18

[56] References Cited

U.S. PATENT DOCUMENTS

| | | | |
|---|---|---|---|
| 5,388,267 | 2/1995 | Chen et al. | 371/11.1 |
| 5,440,711 | 8/1995 | Sugimoto . | |
| 5,465,339 | 11/1995 | Garinger et al. . | |
| 5,471,674 | 11/1995 | Stewart et al. | 395/833 |
| 5,473,770 | 12/1995 | Vrba . | |
| 5,475,645 | 12/1995 | Wada . | |
| 5,479,639 | 12/1995 | Ewertz et al. | 395/430 |
| 5,479,640 | 12/1995 | Cartman et al. . | |
| 5,487,161 | 1/1996 | Koenck et al. | 395/442 |
| 5,511,176 | 4/1996 | Tsuha . | |
| 5,530,847 | 6/1996 | Schieve et al. | 395/183.14 |
| 5,579,522 | 11/1996 | Christeson et al. | 395/653 |
| 5,630,099 | 5/1997 | MacDonald et al. | 395/497.03 |
| 5,793,943 | 8/1998 | Noll | 395/182.04 |

*Primary Examiner*—Robert W. Beausoliel, Jr.
*Assistant Examiner*—Nadeem Iqbal
*Attorney, Agent, or Firm*—Robert E. Bushnell, Esq.

[57] ABSTRACT

A reprogramming device of a flash memory includes: a flash memory which stores BIOS data for a computer system; a central process unit which outputs an address signal after reading the BIOS data from the flash memory; random access memory which stores new BIOS data; and a controller driven by the address signal of the central process unit, which writes the new BIOS data of the random access memory on the flash memory. The device also includes a switch which controls an operation of the flash memory; and a reprogrammer which makes it possible to reprogram the flash memory. The reprogramming can occur even when the flash memory is mounted in a main board and when the flash memory can not boot the computer system because of damaged BIOS data.

15 Claims, 3 Drawing Sheets

REPROGRAMMING DEVICE OF A FLASH MEMORY

CLAIM OF PRIORITY

This application makes claims all benefits accruing under 35 U.S.C. §119 from an application for REPROGRAMMING DEVICE OF A FLASH MEMORY earlier filed in the Korean Industrial Property Office on Dec. 5, 1995 and there duly assigned Ser. No. 46780/1995.

BACKGROUND OF THE INVENTION

1. Field of the Invention

The present invention relates to a reprogramming device of a flash memory. More particularly, the present invention relates to a reprogramming device of a flash memory which makes the damaged flash memory usable again by reprogramming the flash memory.

2. Description of the Related Art

As is well-known, an effective memory and an effective memory handling is neccessary for an effective computer system. Among memories of a computer system, some situations involving memories (such as those involving flash memories) may require operations such as reprogramming, refresh, etc. before being usable again. An exemplar, of a contemporary practice in the related arts, is Tsuha (U.S. Pat. No. 5,511,176, *Microcomputer Capable Of Accessing To An External Memory With Least Possible Wait*, Apr. 23, 1996) disclosing a microcomputer capable of accessing to an external memory with least possible wait. In a refresh pulse producing circuit of a microcomputer, an access detection section detects access to a non-refresh memory area of an external memory to produce a non-refresh memory signal indicative of the access. Cartman et al. (U.S. Pat. No. 5,479,640, *Memory Access System Including A Memory Controller With Memory Redrive Circuitry*, Dec. 26, 1995) discloses a memory access for improving memory access when addressing dynamic random access modules (DRAMs). The memory access system includes a main memory and a memory controller. The main memory hardware redrives the last row address to the DRAMs after the completion of an access, so that the memory controller need not provide a row address to the memory for each command of a command sequence. Wada (U.S. Pat. No. 5,475,645, *Memory Module Using DRAM And Method Of Refreshing The Memory Module*, Dec. 12, 1995) discloses a memory module using a large capacity DRAM without a self-refresh mode, which maintains the contents of the memory irrespective of non-input of a refresh signal from a computer. Vrba (U.S. Pat. No. 5,473,770, *Fault-Tolerant Computer System With Hidden Local Memory Refresh*, Dec. 5, 1995) discloses a fault tolerant computer system having a plurality of processor modules having independent clocks for processing an instruction stream, global memory accessible by all of the processor modules, and a local memory configured within each processor modules and clocked synchronously therewith. The local memory is periodically refreshed or the refresh is aborted depending upon the number of clock cycles available before a local memory access occurs. Garinger et al. (U.S. Pat. No. 5,465,339, *Decoupled Refresh On Local And System Busses In A PC/AT Or Similar Microprocessor Environment*, Nov. 7, 1995) disclose a decoupled refresh on local and system busses in a PC/AT or similar microprocessor environment. Sugimoto (U.S. Pat. No. 5,440,711, *Method For Controlling DRAM Memory In A Microcomputer*, Aug. 8, 1995) discloses a microcomputer capable of elimination of the need of an external circuit and hence timing adjustment of the same, and of direct connection thereof to a memory. The DRAM controller includes a refresh controller for refreshing a DRAM. My study of the prior art and of the contemporary practice indicates a need for an effective reprogramming device of a flash memory which makes the damaged flash memory usable again by reprogramming the flash memory.

SUMMARY OF THE INVENTION

Accordingly, an object of the present invention is to provide an improved reprogramming device of a flash memory.

Another object of the present invention is to provide an improved reprogramming device of a flash memory which makes the damaged flash memory usable again by reprogramming the flash memory.

Another object of the present invention is to provide a reprogramming device that reprograms a flash memory under the condition that the flash memory is mounted in the main board.

Another object of the present invention is to provide a reprogramming device that reprograms a flash memory when a flash memory can not boot a computer system because the contents of a Basic Input Output System (BIOS), related to a basic operation of a computer system, are damaged in the flash memory.

Another object of the present invention is to provide a reprogramming device of a flash memory which can make the damaged flash memory usable again by reprogramming the flash memory which can not boot because of damage of the contents of the BIOS related to a basic operation of a computer system, under the condition of the flash memory being mounted in a main board.

To achieve one or more of these objects, a reprogramming device of a flash memory includes: a flash memory which stores BIOS data for a computer system; a central process unit which outputs an address signal after reading the BIOS data from the flash memory; random access memory which stores new BIOS data; and a controller driven by the address signal of the central process unit, which writes the new BIOS data of the random access memory on the flash memory. The device also includes a switch means which controls an operation of the flash memory; and reprogramming means which makes it possible to reprogram the flash memory under the condition that the flash memory is mounted in a main board when the flash memory can not boot the computer system because of damaged BIOS data.

To achieve these objects, the reprogramming device of a flash memory can use the steps of: disabling the flash memory; enabling the reprogramming means in order to reprogram the flash memory; and supplying power to the system for reprogramming. In addition, the steps can use the steps of initializing the system by reading the data from the reprogramming means; copying to the RAM a new BIOS data read from the reprogramming means; disabling the reprogramming means; enabling the flash memory for reprogramming; and reprogramming the flash memory after reading the BIOS data and turning off the system power.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

In the drawings.

DETAILED DESCRIPTION OF THE PREFERRED EMBODIMENTS

Figure 1:
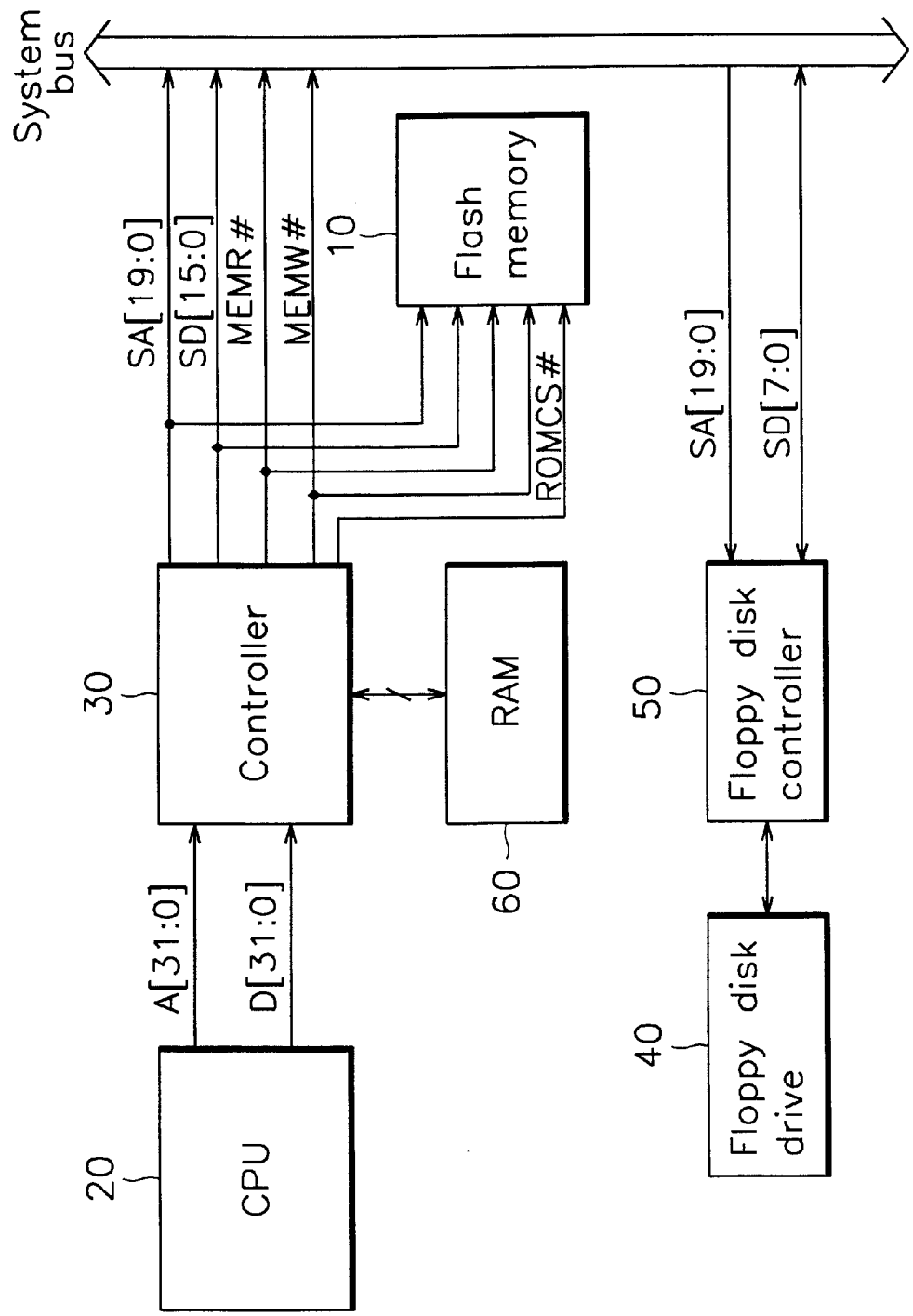
FIG. 1 is a block diagram illustrating a structure of a reprogramming device of a flash memory according to a contemporary practice.

Turning now to the drawings, FIG. 1 shows a reprogramming device of a flash memory according to a contemporary practice. This reprogramming device of a flash memory includes a flash memory 10 which stores BIOS data for a computer system, and a central process unit 20 which outputs an address signal after reading the BIOS data from the flash memory 10, a controller which performs read/write operation on the flash memory 10 by the address signal from the central process unit 20. The reprogramming device also includes a floppy disk drive 40 for reading the data recorded on a floppy disk or writing data on a floppy disk, a floppy disk controller 50 which outputs a control signal for operating the floppy disk drive 40, and a RAM 60 which stores the BIOS data of the flash memory 10 by the controller 30 and the floppy disk controller 50.

The operation of a reprogramming device of a flash memory, which has the above-mentioned structure, is as follows. In the situation of reading the BIOS data in the flash memory 10, the central process device 20 enables the controller by outputting an address signal when power is supplied to a computer system. The enabled controller 30, by the central process device 20, reads the BIOS data stored in the flash memory 10 through the data bus SD[7:0] by activating a ROM selection signal ROMCS#, a signal for reading a data MEMR# and an address signal SA[19:0] of the flash memory 10. Also, the controller 30 delivers the BIOS data read through the data bus SD[7:0] to the central process device 20 through a data bus D[31:0].

In the situation of altering the BIOS data first recorded on the flash memory 10, the floppy disk is inserted. This stores a new BIOS data into the floppy disk drive 40. The floppy disk drive 40 reads the BIOS data on the floppy disk, when being driven by the floppy disk controller 50 which outputs a control signal after receiving a command from the central process device 20. The BIOS data read by the floppy disk drive, is inputted into the controller 30 through the data bus SD[7:0] and the controller 30 stores the BIOS data on the RAM 60. At this step, the controller 30 removes the BIOS data stored on the flash memory 10 and then reprograms the flash memory 10 by activating the address signal SA[19:0] of the flash memory 10, the signal for writing a data MEMW and the ROM selection signal ROMCS#, after reading a new BIOS data stored on the RAM 60 through the data bus SD[7:0].

If the flash memory 10 is removed or the power is turned off at this programming step, the contents of the flash memory 10 are damaged. Accordingly, the system can not be booted and the flash memory 10 must be replaced. Also, such a reprogramming device of a flash memory of a contemporary practice has a disadvantage in that it is difficult to replace the flash memory because the flash memory is brazed on the main board.

Figure 2:
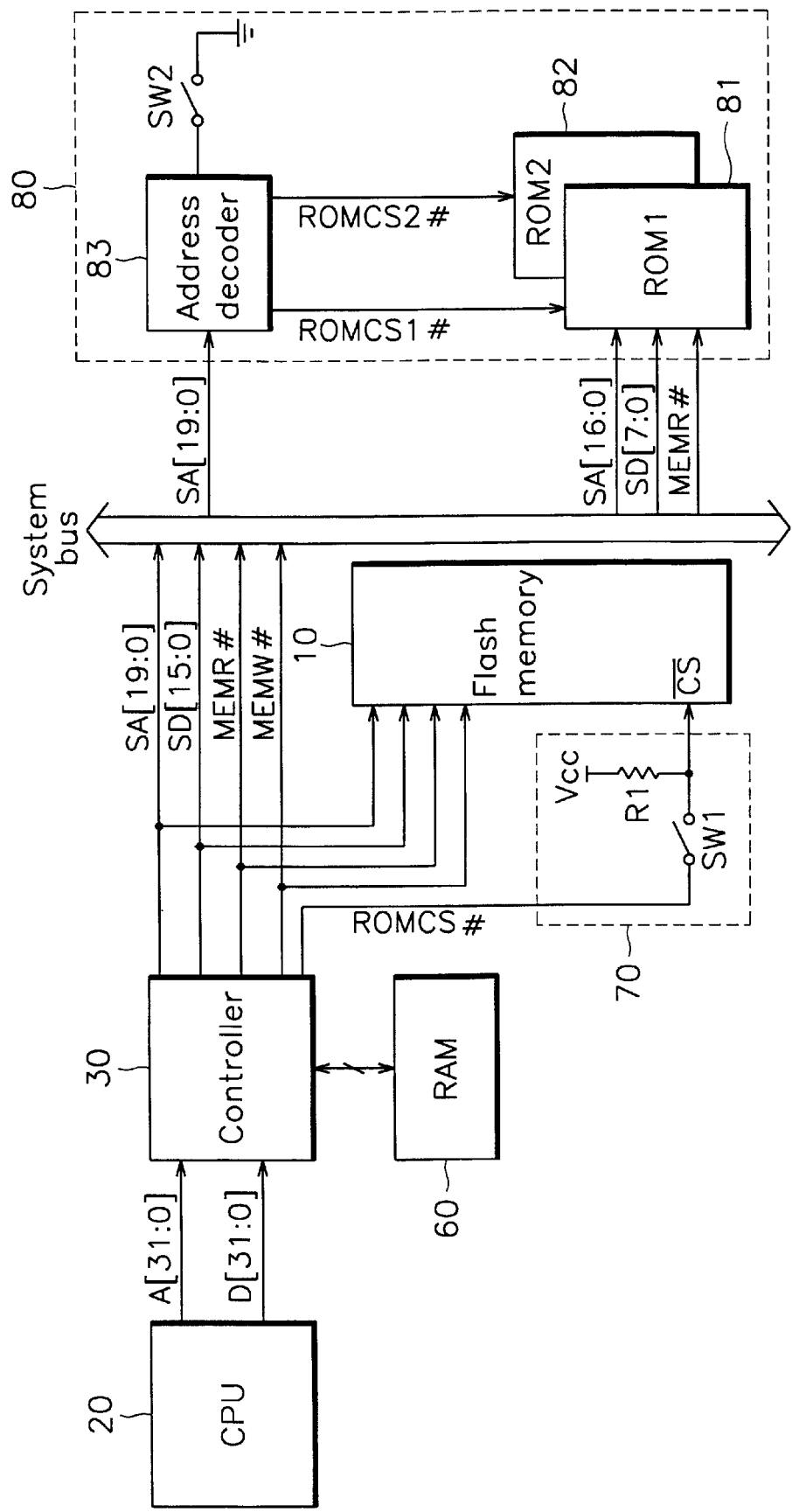
FIG. 2 is a block diagram illustrating a structure of a reprogramming device of a flash memory built in accordance with the principles of a preferred embodiment of the present invention.
Figure 3:
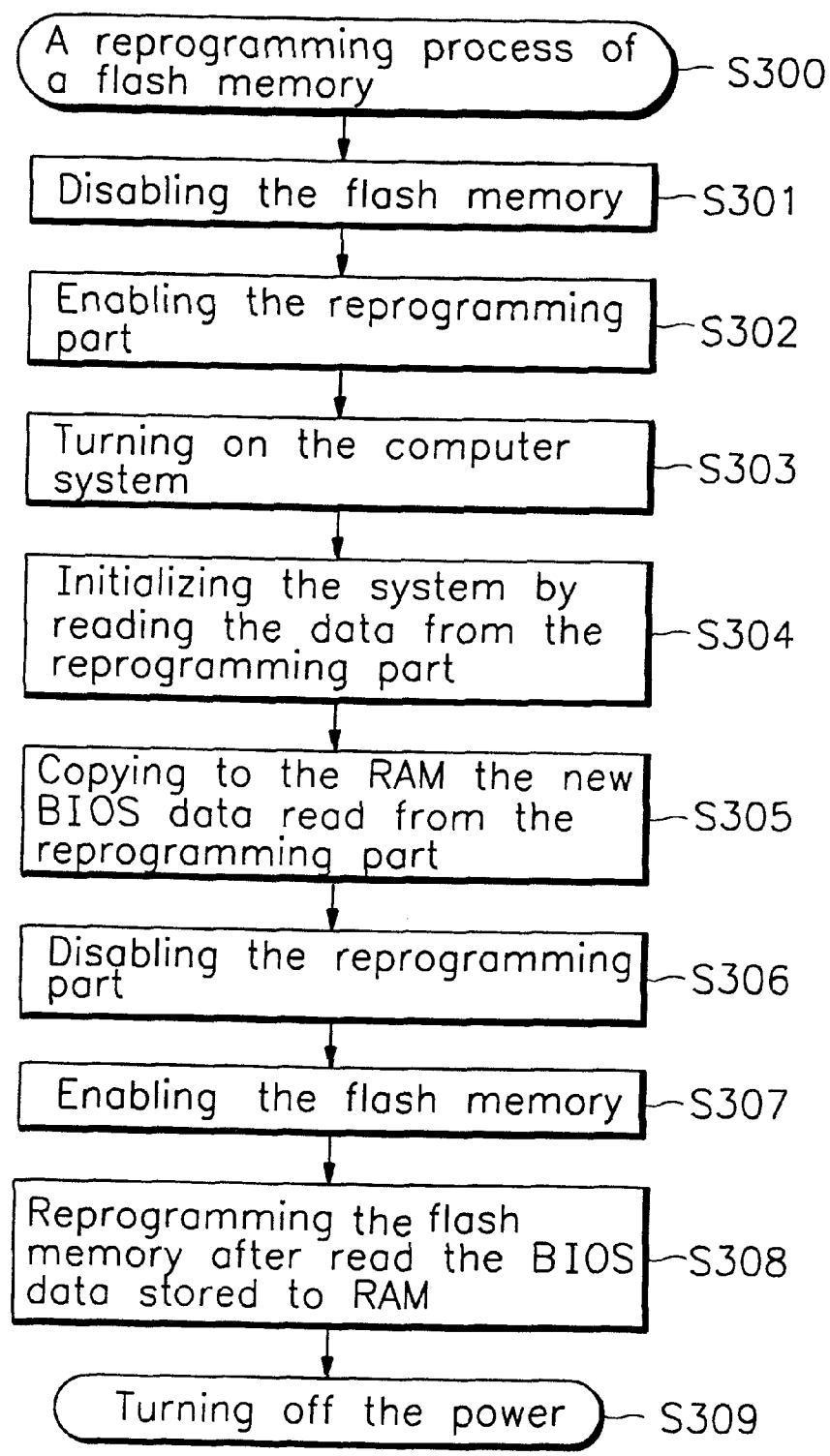
FIG. 3 is a flow chart for reprogramming a flash memory built in accordance with the principles of a preferred embodiment of the present invention.

As shown in FIG. 2, the reprogramming device of a flash memory in accordance with the purpose of the invention includes a flash memory 10 which stores BIOS data for a computer system, a central process unit 20 which outputs an address signal after reading the BIOS data from the flash memory, a random access memory 60 which stores new BIOS data, and a controller 30 driven by the address signal of the central process unit, which writes the new BIOS data of the random access memory on the flash memory. In addition, the device may include a switch 70 which controls an operation of the flash memory; and a reprogrammer 80 which makes it possible to reprogram the flash memory under the condition that the flash memory is mounted in a main board and that the flash memory can not boot the computer system because of damaged BIOS data.

The switch 70 includes a terminal Vcc and a pull-up resistor serially connected with a chip selection terminal of the flash memory 10, and a first switch SW1 whose one terminal is connected with a ROM selection signal ROMCS# and the other terminal is connected with the terminal Vcc and the pull-up resistor. The ROM selection signal ROMCS# is outputted from the controller 30 and the terminal Vcc and the pull-up resistor R1 turns on/off the flash memory chip.

The reprogrammer 80 includes a first ROM 81 which stores the data for operating or initializing or testing a computer system, a second ROM 82 which stores a new BIOS data, an address decoder 83 enabling a first ROM 81 and a second ROM 82 by decoding the signal outputted from the controller 30 and a second switch SW2 whose one terminal is connected with the address decoder 83 and another terminal is grounded. The second switch SW2 turns on/off the ROM chip selection signal ROMCS1#, ROMCS2# outputted from the address decoder 83.

The operation of the reprogramming device of a flash memory according to a preferred embodiment of the present invention, can be as follows. The user turns off the first switch SW1 of the switch 70, makes the flash memory 10 disable, and makes the reprogrammer 80 enable after turning on the second switch SW2. The central process device 20 enables the controller 30 when power is supplied to a computer system, and the controller 30 outputs an address signal for initializing a computer system through an address bus SA[19:0]. The address decoder 83, which receives an address signal outputted from the controller 30 as an input, initializes and tests a system after reading data from a first ROM 81 by activating a first ROM selection signal ROMSC1#.

At this step, if the controller 30 outputs an address signal SA[19:0] for writing a new BIOS data on the flash memory 10, the address decoder 83 reads a new BIOS data from the second ROM 82 by decoding the address signal SA[19:0] and activating the second ROM selection signal ROMCS2#, and stores the data on the RAM 60 in the system. At this step, the first switch SW1 is off although power is supplied. Accordingly, in order that a programming operation is not interrupted by the reprogrammer 80 during programming the flash memory 10 with a new BIOS data, the flash memory 10 must be enabled by turning on the first switch SW1 and the first ROM selection signal ROMCS1# and the second ROM selection signal ROMCS2# must be disabled by turning off the second switch SW2. The first ROM selection signal ROMCS1# is an output signal of the address decoder 83 of the reprogrammer 80. At this step, the flash memory 10 must read a new BIOS data from the RAM 60 in order to be reprogrammed. By turning off power and removing the external reprogrammer 80, all the work is finished and if power is supplied again, the central process device 20 performs normal operation by reading the BIOS data from the flash memory reprogrammed with a new BIOS data.

Therefore, the present invention which operates as above has an effect that a system board need not to be modified. Such operation as above permits a reprogramming of the flash memory under the condition that the flash memory is mounted in the main board. The programming can occur when the contents of a basic Input/Output System, related to a basic operation of a computer system, are damaged, lost, or even missing in the flash memory.

Thus, as mentioned in the previous paragraphs, the present invention can concern a reprogramming device of a flash memory, which includes a flash memory which stores basic input/output system data for a computer system, a central process unit which outputs an address signal after reading the basic input/output system data from the flash memory, a random access memory which stores new basic input/output system data, and a controller driven by the address signal of the central process unit. This writes the new basic input/output system data of the random access memory on the flash memory. The reprogramming device also includes a switch mechanism which controls an operation of the flash memory; and a reprogramming mechanism (or a reprogrammer) which makes it possible to reprogram the flash memory under the condition that the flash memory is mounted in a main board when the flash memory can not boot the computer system because of damaged basic input/output system data. The switch mechanism can include a pull-up terminal serially connected with a chip selection terminal of the flash memory, and a first switch whose one terminal is connected with a read only memory selection signal line and another terminal is connected with the pull-up terminal. The reprogramming mechanism can include a first read only memory which stores data for operating or initializing or testing a computer system, a second read only memory which stores the new basic input/output system data, an address decoder enabling the first read only memory and the second read only memory by decoding a signal outputted from the controller; and a second switch which turns on/off a first and a second read only memory chip selection signal outputted from the address decoder. A reprogramming method of the flash memory includes the steps of disabling a flash memory, enabling reprogramming means in order to reprogram the flash memory, and supplying power to a system for reprogramming. The method can include further steps of initializing the system by reading the data from the reprogramming means, copying to the random access memory a new basic input/output system data read from the reprogramming means, disabling the reprogramming means, enabling the flash memory for reprogramming, and reprogramming the flash memory after reading the basic input/output system data, and turning off a system power.

What is claimed is:

1. A reprogramming device of a flash memory comprising:
   a flash memory storing a first set of basic input and output system data for a computer system, the basic input and output system data representing information of input and information of output;
   a central process unit outputting an address signal after reading the basic input and output system data from said flash memory, the address signal representing information of address;
   a random access memory storing a second set of basic input and output system data;
   a controller driven by the address signal of said central process unit, said controller writing the second set of basic input and output system data of said random access memory onto said flash memory;
   a switch means controlling an operation of said flash memory wherein said switch means comprising:
      a pull-up resistor connected between a voltage source terminal and a chip selection terminal of said flash memory; and
      a first switch having a first switch terminal and a second switch terminal, the first switch terminal being connected with a read only memory selection signal line output from said controller and the second switch terminal being connected with a node connecting said pull-up resistor to said chip selection terminal of said flash memory; and
   a reprogrammer permitting a reprogramming of said flash memory, said reprogrammer comprising:
      a first read only memory storing initializing data, storing operating data, and storing testing data, the initializing data being for initializing the computer system, the operating data being for operating the computer system, the testing data being for testing the computer system;
      a second read only memory storing the second set of basic input and output system data;
      an address decoder enabling said first read only memory by decoding a signal output from said controller, and enabling said second read only memory by decoding said signal output from said controller; and
      a second switch turning on and off first and second read only memory chip selection signals output from said address decoder, the first and second read only memory chip selection signals representing information on selection among read only memory chips.

2. A reprogramming method of a flash memory comprising the steps of:
   disabling the flash memory;
   enabling a reprogrammer;
   supplying power to a system for reprogramming;
   initializing the system by reading data from the reprogrammer;
   copying a new basic input and output system data read from the reprogrammer, to a random access memory;
   disabling the reprogrammer;
   enabling the flash memory for reprogramming;
   reprogramming the flash memory after reading the basic input and output system data from said random access memory; and
   turning off a system power.

3. A reprogramming device of a flash memory comprising:
   a flash memory storing a basic input/output system (BIOS) data for a computer system;
   a first manual switch connected to a chip select terminal of said flash memory;
   a reprogrammer connectable to a system bus, said reprogrammer comprising a read only memory storing new basic input/output system (BIOS) data for a computer system;
   said reprogrammer further comprising an address decoder for receiving an address signal via said system bus;
   a second manual switch connected to said address decoder;

a controller for outputting said address signal to said system bus, said address decoder being enabled by said second manual switch to generate a read only memory chip select signal, when said address decoder decodes said address signal and determines that said address signal requests writing of said new basic input/output system (BIOS) data to said flash memory, for enabling said new basic input/output system (BIOS) data to be read from said read only memory and stored in said random access memory via said controller, when said first manual switch is activated to disable said flash memory; and said controller reading out said new basic input/output system (BIOS) data from said random access memory for storage into said flash memory, when said first manual switch is activated to permit said flash memory to be enabled by a read only memory chip select signal generated by said controller and said second manual switch is activated to disable said address decoder.

4. The reprogramming device as set forth in claim 3, wherein said first manual switch comprises a first terminal connected to receive said read only memory chip select signal generated by said controller, a second terminal connected to said chip select terminal of said flash memory, and a resistor connected between a voltage source and said chip select terminal of said flash memory.

5. The reprogramming device as set forth in claim 3, wherein said second manual switch comprises a first terminal connected to a ground terminal and a second terminal connected to said address decoder.

6. The reprogramming device as set forth in claim 3, wherein said reprogammer further comprises a second read only memory for storing data for initializing a computer system, said data for initializing said computer system being read from said second read only memory when said address decoder decodes an address signal requesting initialization of said computer system and when said first manual switch is activated to disable said flash memory and said second manual switch is activated to enable said address decoder.

7. The reprogramming device as set forth in claim 3, further comprising a central processing unit for controlling said controller.

8. The reprogramming device as set forth in claim 6, wherein said address decoder generate another read only memory chip select signal for selecting said second read only memory when said address signal requests initialization of said computer system.

9. A reprogramming device of a flash memory comprising:

a flash memory storing a basic input/output system data for a computer system;

a first manual switch connected to a chip select terminal of said flash memory;

a reprogrammer connectable to a system bus, said reprogrammer comprising a first read only memory for storing data for initializing a computer system, a second read only memory storing new basic input/output system data for a computer system, an address decoder for receiving an address signal via said system bus and a second manual switch connected to said address decoder;

a controller for outputting said address signal to said system bus, said address decoder being enabled by said second manual switch to generate a first read only memory chip select signal for selecting said second read only memory when said address decoder decodes said address signal and determines that said address signal requests initialization of said computer system and to generate a second read only memory chip select signal, when said address decoder decodes said address signal and determines that said address signal requests writing of said new basic input/output system data to said flash memory, when said first manual switch is activated to disable said flash memory.

10. The reprogramming device as set forth in claim 9, further comprising a central processing unit for controlling said controller to generate said address signal, said address signal requesting initialization of said computer system when power is initially applied to said computer system.

11. The reprogramming device as set forth in claim 9, further comprising a central processing unit for controlling said controller to generate said address signal, said address signal requesting writing of said new basic input/output system data to said flash memory when it is determined that said flash memory can not boot said computer system because said basic input/output system data is corrupt.

12. The reprogramming device as set forth in claim 11, wherein said controller stores said new basic input/output system data read from said second read only memory said random access memory; and said controller reads out said new basic input/output system data from said random access memory for storage into said flash memory, when said first manual switch is activated to permit said flash memory to be enabled by a read only memory chip select signal generated by said controller and said second manual switch is activated to disable said address decoder.

13. The reprogramming device as set forth in claim 12, wherein said first manual switch comprises a first terminal connected to receive said read only memory chip select signal generated by said controller, a second terminal connected to said chip select terminal of said flash memory, and a resistor connected between a voltage source and said chip select terminal of said flash memory.

14. The reprogramming device as set forth in claim 12, wherein said second manual switch comprises a first terminal connected to a ground terminal and a second terminal connected to said address decoder.

15. The reprogramming device as set forth in claim 13, wherein said second manual switch comprises a first terminal connected to a ground terminal and a second terminal connected to said address decoder.

* * * * *

UNITED STATES PATENT AND TRADEMARK OFFICE
CERTIFICATE OF CORRECTION

PATENT NO. : 5,915,080　　　　　　　　　　　　　　　　　　　　Page 1 of 1
APPLICATION NO. : 08/758769
DATED : June 22, 1999
INVENTOR(S) : Hong-Kil Park It is certified that error appears in the above-identified patent and that said Letters Patent is hereby corrected as shown below:

In O.G. page please correct:

Title page
(30) Foreign Application Priority Data;

From　" May 12, 1995　[KR] Rep of Korea . . . . 95-46780 "

To　-- December 5, 1995　[KR] Rep of Korea . . . . 95-46780 --

Signed and Sealed this

Seventeenth Day of April, 2007

JON W. DUDAS
*Director of the United States Patent and Trademark Office*